United States Patent
Ramaraju (10) Patent No.: US 8,542,048 B2
(45) Date of Patent: Sep. 24, 2013

(54) DOUBLE EDGE TRIGGERED FLIP FLOP

(75) Inventor: Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 71 days.

(21) Appl. No.: 13/150,322

(22) Filed: Jun. 1, 2011

(65) Prior Publication Data
US 2012/0306556 A1    Dec. 6, 2012

(51) Int. Cl.
*H03K 3/289* (2006.01)

(52) U.S. Cl.
USPC ............................ 327/202; 327/199; 327/200

(58) Field of Classification Search
USPC ......................................... 327/199, 200, 202
See application file for complete search history.

(56) References Cited

U.S. PATENT DOCUMENTS

| | | | |
|---|---|---|---|
| 5,179,295 A | 1/1993 | Mattison et al. | |
| 5,751,174 A | 5/1998 | Kuo et al. | |
| 5,793,236 A | 8/1998 | Kosco | |
| 6,300,809 B1 | 10/2001 | Gregor et al. | |
| 6,462,596 B1 | 10/2002 | Varma | |
| 6,489,825 B1 | 12/2002 | Pasqualini | |
| 6,608,513 B2 | 8/2003 | Tschanz et al. | |
| 6,784,694 B2 | 8/2004 | Kim et al. | |
| 6,794,916 B1 | 9/2004 | Varma | |
| 6,794,976 B2 | 9/2004 | Sigl | |
| 7,161,846 B2 | 1/2007 | Padaparambil | |
| 7,548,102 B2 | 6/2009 | Ramaraju et al. | |
| 7,671,653 B2 | 3/2010 | Harris et al. | |
| 2005/0018997 A1 | 1/2005 | Bleeker | |
| 2006/0104124 A1 | 5/2006 | Padaparambil | |
| 2007/0069789 A1* | 3/2007 | Do et al. | 327/218 |
| 2010/0034030 A1* | 2/2010 | Asano et al. | 365/189.05 |
| 2011/0095799 A1 | 4/2011 | Ramaraju et al. | |
| 2011/0095800 A1* | 4/2011 | Ramaraju et al. | 327/211 |
| 2012/0032720 A1 | 2/2012 | Sofer | |

OTHER PUBLICATIONS

Pedram, M., et al., "A New Design of Double Edge Triggered Flip-Flops", IEEE Conferences, Design Automation Conference 1998 Proceedings of the ASP-DAC 1998, Asia and South Pacific, 1998, pp. 417-421.

Mishra, S.M., et al., "High Performance Double Edge-Triggered Flip-Flop Using a Merged Feedback Technique", IET Journals, Circuits, Devices and Systems, IEEE Proceedings, vol. 147, Issue 6, 2000, pp. 363-368.

Johnson, T.A., et al., "A Single Latch, High Speed Double-Edge Triggered Flip-Flop", IEEE Conferences, , The 8th IEEE International Conference on Electronics, Circuits and Systems, vol. 1, 2001, pp. 189-192.

(Continued)

*Primary Examiner* — John Poos
(74) *Attorney, Agent, or Firm* — James L. Clingan, Jr.; Mary Jo Bertani (57) ABSTRACT

A dual edge triggered flip flop circuit uses clock signals that are delayed from a first clock signal and from one another by respective intervals. A first set of the plurality of clock signals are used to operate a first latch circuit to allow first data to be conducted to a storage element for a period of time after a rising edge of a first clock signal. The clock signals are further used to operate a second latch circuit to allow second data to be conducted to the storage element for a period of time after a falling edge of the first clock signal.

14 Claims, 3 Drawing Sheets

(56) References Cited

OTHER PUBLICATIONS

Hossain, R., et al., "Low Power Design Using Double Edge Triggered Flip-Flops", IEEE Transactions on Very Large Scale Integration (VLSI) Systems, vol. 2, Issue 2, 1994, pp. 261-265.

Afghahi, M., "Double Edge-Triggered D-Flip-Flops for High-Speed CMOS Circuits", IEEE Journal of Solid-State Circuits, vol. 26, Issue 8, 1991, pp. 1168-1170.

Phyu, M.W., et al., "Power-Efficient Explicit-Pulsed Dual-Edge Triggered Sense-Amplifier Flip-Flops", IEEE Transactions on Very Large Scale Integration (VLSI) Systems, vol. 19, No. 1, Jan. 2011, pp. 1-9.

Nedovic, N., et al., "Dual-Edge Triggered Storage Elements and Clocking Strategy for Low-Power Systems", IEEE Transactions on Very Large Scale Integration (VLSI) Systems, vol. 13, No. 5, May 2005, pp. 577-590.

* cited by examiner

DOUBLE EDGE TRIGGERED FLIP FLOP

BACKGROUND

1. Field

This disclosure relates generally to flip flops, and more specifically, to flip flops that are double edge triggered.

2. Related Art

Typically, edge triggered flip flops transfer data on one edge of a clock, often the rising edge+, and transfer data out on the second edge of the clock, which would then be the falling edge. The result is that there is a single data change for each full cycle of the clock. Double edge triggered flip flops (DET flops) allow for a data change on each edge of the clock. DET flops are thus used to either double the data rate for a given clock rate or reduce the clock rate in half while maintaining the data rate. Often the data rate is fixed by factors unrelated to the flip flops in which case DET flops can be used to save power by reducing the clock rate for many of the flip flops by implementing DET flops. One issue is that DET flops tend to require significantly more area on the integrated circuit than typical flip flops. Also, an issue with DET flops is that they tend to utilize pulses for timing. Pulses generally do not transmit well so some DET flops have been designed to have their own pulse generator thus exacerbating the problem with requiring more area.

Accordingly, there is a need for a DET flip flop improving upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A dual edge triggered flip flop (DET flop) combines three portions of circuitry by which a first portion is alternately combined with second and third portions. At one clock edge data is latched using the first portion and one of the second and third portions. At a time prior to the next clock edge, the other of the second and third portions is used for receiving the data to be latched at the next clock edge. When the next clock edge arrives, the other of the second and third portions combines with the first portion to latch the new data. The portion of the second and third portions that was previously used for latching then becomes available for receiving the next data on the next clock edge. This is better understood by reference to the drawings and the following description.

Figure 1:
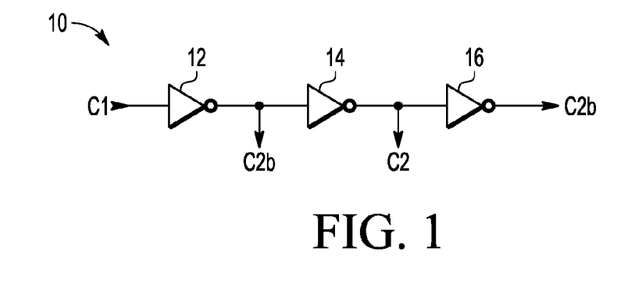
FIG. 1 is a circuit for generating a plurality of clocks useful in operating a DET flip flop according to the embodiments.

Shown in FIG. 1 is a clock circuit 10 comprising an inverter 12, an inverter 14, and an inverter 16. Inverter 12 has an input for receiving a clock C1 and an output for providing a clock C1b that is inverted from clock C1 by a delay provided inherently by inverter 12. The delay of an inverter can be adjusted by layout and sizing. Inverter 14 has an input connected to the output of inverter 12 for receiving clock C1b and has an output for providing clock C2 which is inverted and delayed from clock C1b. Clock C2 is delayed even more from clock C1. Inverter 16 has an input connected to the output of inverter 14 for receiving clock C2 and has an output for providing a clock C2b inverted and delayed from clock C2. Clock C2b is delayed even more from clock C1b. Clocks C1b, C2, and C2b are shown as generated in a series of inverters in which each inverter provides one of the clocks. If additional delay is required, one approach is to an additional pair of inverters between clocks. For example, clock C2 could be provided by three inverters in series instead of a single inverter. Also all of the clocks are shown as being generated by a single series of inverters but a particular clock could be generated in parallel with other clocks. For example, an alternative clock C2 could be generated by an inverter or three series inverters connected to the output of inverter 12 in addition to inverter 14 being connected to the output of inverter 12.

Figure 2:
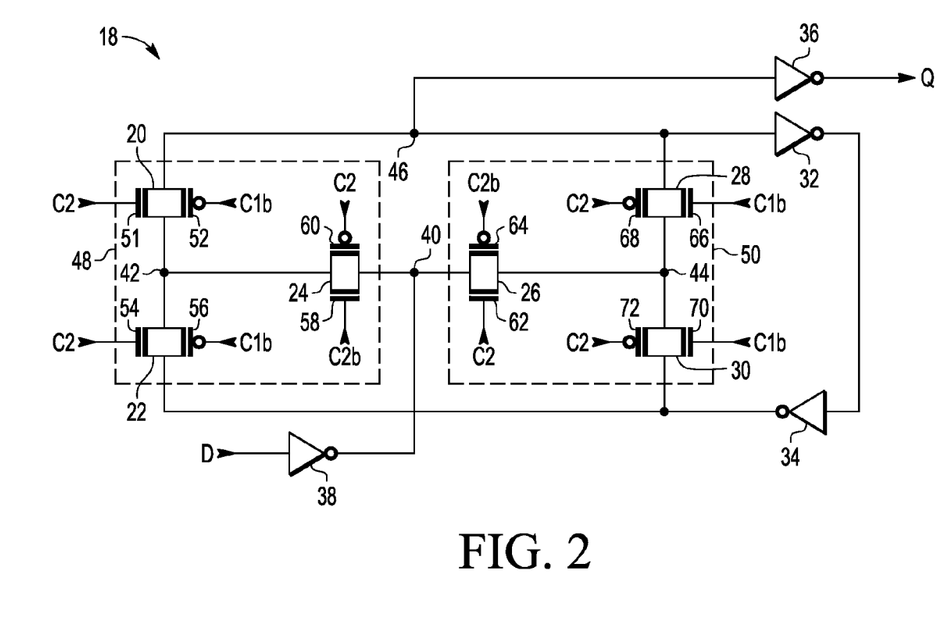
FIG. 2 is a circuit diagram of a DET flip flop according to a first embodiment.

Shown in FIG. 2 is a circuit diagram of a DET flop 18 comprising a transmission gate 20, a transmission gate 22, a transmission gate 24, a transmission gate 26, a transmission gate 28, a transmission gate 30, an inverter 32, an inverter 34, an inverter 36, and an inverter 38. Each of these elements is connected to one or more of nodes 40, 42, 44, and 46. Transmission gates 20, 22, and 24 form a latch portion 48. Transmission gates 26, 28, and 30 form a latch portion 50. Transmission gates 20, 22, 24, 26, 28, and 30 each comprise an N channel transistor and a P channel transistor having their current electrodes connected in parallel between signal terminals of the transmission gate. The gate of the N channel transistor is a non-inverting control input of the transmission gate. The gate of the P channel transistor is the inverting control input of the transmission gate. Transmission gates 20, 22, 24, 26, 28, and 30 include N channel transistors 51, 54, 58, 62, 66, and 70, respectively, and P channel transistors 52, 56, 60, 64, 68, and 72, respectively. Transmission gate 20 has its first signal terminal connected to node 46, its second signal terminal connected to node 42, its non-inverting input for receiving clock C2, and its inverting input for receiving clock C1b. Transmission gate 22 has its first signal terminal connected to node 42, its second signal terminal connected to the second signal input of transmission gate 30, its non-inverting input for receiving clock C2, and its inverting input for receiving clock C1b. Transmission gate 24 has its first signal terminal connected to node 42, its second signal terminal connected to node 40, its non-inverting input for receiving clock C2b, and its inverting input for receiving clock C2. Transmission gate 26 has its first signal terminal connected to node 40, its second signal terminal connected to node 44, its non-inverting input for receiving clock C2, and its inverting input for receiving clock C2b. Transmission gate 28 has its first signal terminal connected to node 46, its second signal terminal connected to node 44, its non-inverting input for receiving clock C2, and its inverting input for receiving clock C1b. Transmission gate 20 has its first signal terminal connected to node 44, its non-inverting input for receiving clock C2, and its inverting input for receiving clock C1b. Inverter 32 has an input connected to node 46, and an output. Inverter 34 has an input connected to the output of inverter 32 and an output connected to the second signal terminals of transmission gates 22 and 30. Inverter 36 has an input connected to node 46 and an output for providing output Q as the output of DET flop 18. Inverter 38 has an input for receiving an input signal D as the input of DET flop 18 and an output connected to node 40.

In operation, input signal D is inverted by inverter 38 and applied to node 40. Inverter 38 is for ensuring a sufficiently strong signal being applied to node 40 and may not be required in some applications. Similarly, output Q is provided by inverter 36 as an inversion of the logic state present on node 46. Inverter 36 is present to ensure output Q is a sufficiently strong signal and may not be required in some applications. For describing the operation of DET flop 18, an initial condition is assumed with clock C1 at a logic low and node 46 latched with transmissions gates 28 and 30 and inverters 32 and 34 providing the latching. Transmission gates 28 and 30 are conductive with clock C2 at a logic low and clock C1b at a logic high. Transmission gates 20 and 22 are non-conductive with clock C2 at a logic low and clock C1b at a logic high. Transmission gate 24 is conductive with clock C2 at a logic low and clock C2b at a logic high. Transmission gate 26 is non-conductive with clock 2 at a low and clock C2b at a logic high. This condition is shown in the timing diagram of FIG. 3 at the time prior to t1 which is when clock C1 is shown as transitioning from a logic low to a logic high. At this time prior to t1, the signal present at node 40 is coupled to node 42 through transmission gate 24 the signal and the signal present at node 40 is allowed to change until the clock C1 is about to change. The signal at node 40 and thus node 42 must be stable sufficiently prior to being latched. This point in time at which node 42 must be stable can be called setup. The time period for setup before clock C1 changes may be called the setup time. In this case, the setup time can be very short relative to clock C1 in part because DET flop 18 first responds to clock C1b, which is delayed from clock C1, for a data change. In this example, at setup, node 42 is a logic high.

Figure 3:
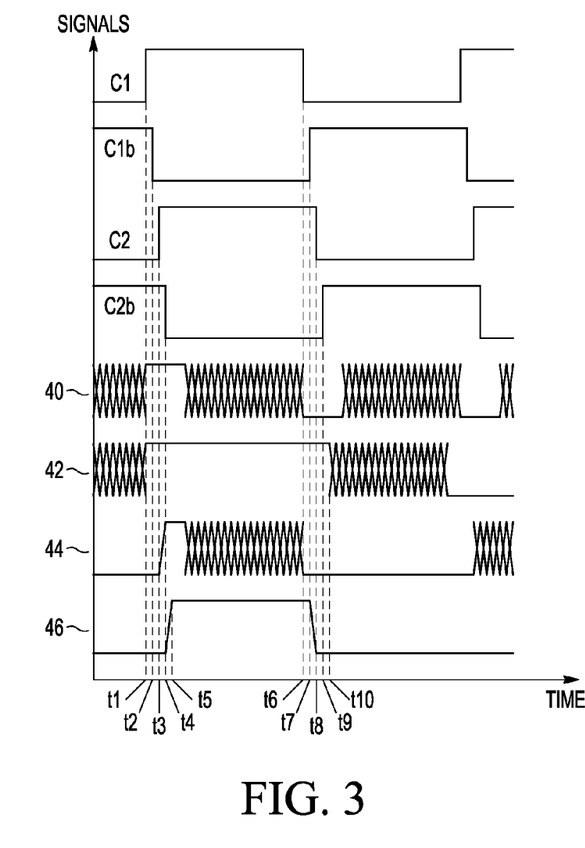
FIG. 3 is a timing diagram useful in understanding the operation of the DET flip flop of FIG. 2.

When clock C1 transitions to a logic high at time t1, clock C1b responds at time t2 by switching to a logic low so that the inverting control inputs of transmission gates 20 and 22 become a logic low, causing transmission gates 20 and 22 to becoming partially conductive. On the other hand, the non-inverting control inputs of transmission gates 28 30 become a logic low, causing transmission gates 28 and 30 to become less conductive. At this point, transmission gate 24 remains fully conductive so that node 42 remains fully driven by the output of inverter 38. At this point, the logic high on node 42 begins changing the logic state of node 42 from a logic low to a logic high. The latching effect of inverters 32 and 34 through transmission gates 28 and 30 begins reducing due to the reduced conductivity of transmission gates 28 and 30. Transmission gate 26 remains non-conductive at this point. Upon the transition of clock C2 to a logic high at time t3, transmission gates 20 and 22 become fully conductive and transmission gates 28 and 30 become non-conductive. Transmission gate 24 becomes partially conductive with clock C2 becoming a logic high while clock C2b remains at a logic high. At time t4, clock C2b transitions to a logic low so that transmission gate 24 becomes non-conductive and transmission gate 26 becomes fully conductive. Transmission gate 26, although changing, does not influence this data change because node 44 is isolated due to transmission gates 28 and 30 being non-conductive. While transmission gate 24 is becoming non-conductive, node 46 has already become of sufficiently high voltage to be recognized as a logic high by inverter 32 so that inverter 32 begins providing a logic low output to the input of inverter 34. Inverter 34 responds by providing a logic high output which, with transmission gates 20 and 22 fully conductive, completes the latching effect so that node 46 is provided as a logic high at or near its final logic high voltage at a time t5 shortly after time t4. Inverter 36 responds by providing output Q as a logic low. Input signal D is held steady for some time after the transition of clock C1 so that the transition of node 46 to a logic high is ensured of being held and not reversed upon a change at node 40. Thus, node 40 is preferably held at the desired logic state, a logic high in this case, until transmission gate 24 is ensured being non-conductive. In this case that would be at least time t5. This amount of time that input signal D must be held constant after time t1 may be called hold time. The effect is that at the time prior to the rising edge of clock C1, time t1, latch portion 48 is not being used to hold the logic state on node 46. In response to the rising edge of clock C1, latch portion 48 progressively latches the logic state of the next data onto node 46 in combination with inverters 32 and 34. Latch portion 50 which prior to time t1 was used for latching the previous data on node 46, is not used in latching the data being latched by latch portion 48 and inverters 32 and 34.

Following time t5 and until the next setup for the next transition of clock C1 at time t6, transmission gate 26 couples the output of inverter 38 to node 44 without affecting node 46 and thus not affecting output Q. At the setup for the transition of clock C1, input signal D is held steady at a logic low, the next logic state to be latched onto node 46, which is shown as being near time t6. With a transition of clock C1 to a logic low, the falling edge of the clock, clock C1b transitions at time t7 to a logic high causing transmission gates 28 and 30 to switch from non-conductive to partially conductive and transmission gates 20 and 22 to switch from fully conductive to partially conductive. This weakens the latching effect of inverters 32 and 34 on node 46 through transmission gates 20 and 22 and begins reducing the voltage of the logic high on node 46 by node 44 being at a logic low and being driven by inverter 38 whose output is passing through fully conductive transmission gate 26 which is shown as becoming evident at time t8 which is also when clock C2 switches to a logic low causing transmission gates 28 and 30 to become fully conductive, transmissions gates 20 and 22 to become non-conductive, transmission gate 24 to switch from non-conductive to partially conductive, and transmission gate 26 to switch from fully conductive to partially conductive. At this point, with transmission gate 20 being non-conductive, node 42 is decoupled from affecting node 46, and with transmission gates 28 and 30 being fully conductive, the latching of node 46 at a logic low is ensured of being completed. At time t9, clock C2b switches to a logic low causing transmission gate 24 to become fully conductive and transmission gate 26 to become non-conductive. The completion of establishing node 46 at a logic low at or near its lowest voltage is shown as occurring at a time t10 soon after time t9. Input signal D is free to change without affecting node 46 after the hold time, which is going to be at or near the time transmission gate 24 becomes non-conductive, time 9. The effect is that at the time prior to the falling edge of clock C1, time t6, latch portion 50 is not being used to hold the logic state on node 46. In response to the falling edge of clock C1, latch portion 50 progressively latches the logic state of the next data onto node 46 in combination with inverters 32 and 34. Latch portion 48 which prior to time t6 was used for latching the previous data on node 46, is not used in latching the data being latched by latch portion 50 and inverters 32 and 34.

Following time t10, the next example is for the data to stay at a logic low. In such case, node 40 is established at a logic low at setup and thus to node 42 with transmission gate 24 conductive. As clocks C1, C1b, C2, and C2b sequentially occur, node 42 is coupled to node 46 and inverters are coupled to node 46 through transmission gates 20 and 22 while transmissions gates 28 and 30 become non-conductive. Node 46 does not change, but the holding of node 46 at a logic low begins with transmission gates 28 and 30 providing the coupling of inverters 32 and 34 to node 46 for latching and ends with transmission gates 20 and 22 providing the coupling of inverters 32 and 34 to node 46 for latching. This provides an efficient use of circuitry by alternating latching portion 48 and latching portion 50 in use with inverters 32 and 34 to latch data on both the rising edge and the falling edge of the clock.

Figure 4:
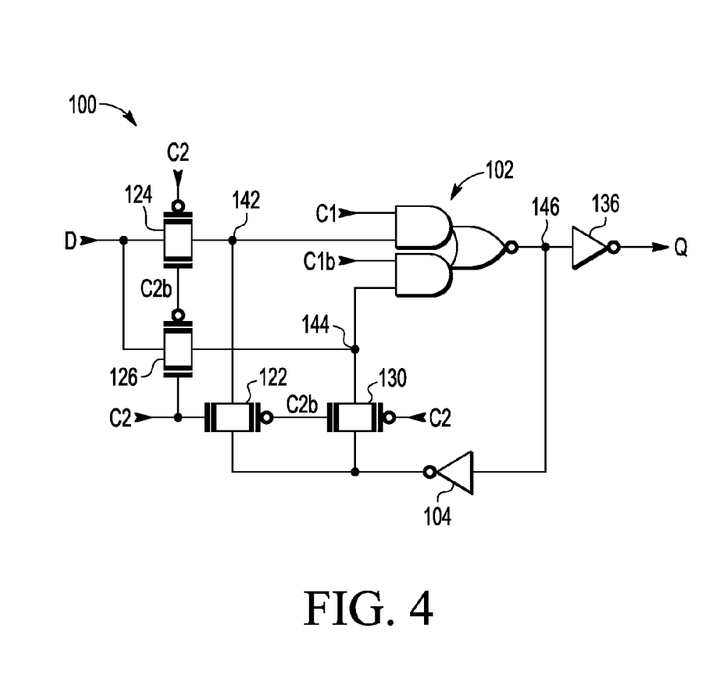
FIG. 4 is a combination circuit and logic diagram of a DET flip-flop according to a second embodiment.

Shown in FIG. 4 is a DET flop 100 similar to DET flop 18 of FIG. 3 with the primary difference between the use of one of the AND-OR-INVERT (AOI) circuits that are well understood to one or ordinary skill in the art. The particular AOI circuit used in DET flop 100 is an AOI22 circuit. An AOI22 circuit has a first AND, a second AND, and a NOR. The effect is that there are two inputs per AND in which the output of each AND is received by one of two inputs of the NOR. A logic high input to a NOR forces the NOR to provide a logic low output. For one of the ANDs to provide a logic high, both inputs to that AND must be a logic high. A logic low to one of ANDs forces that AND to provide a logic low to the NOR and thus allows the other AND to control the output of the NOR. In such one of inputs can be held at a logic low so that the output of the AOI22 is simply the inverse of the other input. The inputs to the AOI22 are divided by the two ANDs and may be called inputs to the first AND and inputs to the second AND. The implementation is known to use 8 transistors, a P and N transistor per input. The AOI22 replaces 3 transmission gates, which is 6 transistors, 3 pairs of P and N transistors. Although using two more transistors, an AOI22 circuit is well known and almost certainly will have a well established performance and known efficient layout. One of the issues with transmission gates is that they tend to have more current leakage and distortion. Thus, it is possible to have minimal area sacrifice while having a performance improvement. The clocks of FIG. 1 are used by DET flop 100. As shown for DET flop 100, input signal D is directly applied to transmission gates instead of to an inverter as is shown for DET flop 18.

DET flop 100 has an AOI22 circuit 102, an inverter 104, a transmission gate 122, a transmission gate 124, a transmission gate 126, a transmission gate 130, and an inverter 136. AOI22 circuit 102 has a first input of the first AND for receiving clock C1, a second input of the first AND connected to a node 142, a first input of the second AND for receiving clock C1$b$, a second input of the second AND connected to a node 144, and an output connected to a node 146. Inverter 104 has an input connected to node 146 and an output. Transmission gate 122 has a first signal terminal connected to node 142, a second signal terminal connected to the output of inverter 104, a non-inverting control input for receiving clock C2, and an inverting control input for receiving clock C2$b$. Transmission gate 124 has a first signal terminal for receiving input signal D, a second signal terminal connected to node 142, an inverting control terminal for receiving clock C2, and a non-inverting control terminal for receiving clock C2$b$. Transmission gate 126 has a first signal terminal for receiving input signal D, a second signal terminal connected to node 144, an inverting control terminal for receiving clock C2$b$, and a non-inverting control terminal for receiving clock C2. Transmission gate 130 has a first signal terminal connected to node 144, a second signal terminal connected to the output of inverter 104, a non-inverting control input for receiving clock C2$b$, and an inverting control input for receiving clock C2. Inverter 136 has an input connected to node 146 and an output for providing output signal Q.

For an example, clock C1 will be at a logic low and node 146 will be at a logic low prior to a rising edge of clock C1. In such case clock C2 is a logic low and clocks C1$b$ and C2$b$ are at a logic high. Transmission gates 122 and 126 are non-conductive and transmission gates 124 and 130 are fully conductive. With clock C1 at a logic low, node 142 is irrelevant in determining the logic state of the output of AIO22 102 which determines the logic state of node 146. With clock C1$b$ at a logic high, node 146 is the inverse of node 144. With node 146 at a logic low, that means node 144 must be a logic high. With inverter 104 having its output coupled to node 144 through transmission gate 130, a latch is formed with AOI22 102 and inverter 104 using transmission gate 130. With transmission gate 124 conductive, input signal D is coupled to node 142.

At setup, in this example, signal D is at a logic low so that a logic high is to be latched at node 146. When clock C1 transitions to a logic high, a rising edge of the clock, clock C2 is a logic low and clock C2$b$ is a logic high so that transmission gate 144 is still coupling input signal D to node 142. When clock C1 transitions to a logic high, clock C1$b$ is still at a logic high but very quickly becomes a logic low. When clock 1$b$ transitions to a logic low, node 144 becomes irrelevant in determining the output of AOI22 102 and thus node 146. With node 142 at a logic low based on input signal D still be coupled to node 142, AOI22 102 provides a logic high output on node 146. After this node clock C2 transitions to a logic high so that transmission gates 130 and 124 switch from fully conductive to partially conductive and transmission gates 122 and 126 switch from non-conductive to partially conductive. This begins the latching of node 146 using inverter 104. Clock C2$b$ then switches to a logic low so that transmission gates 130 and 124 switch from partially conductive to non-conductive and transmission gates 122 and 126 switch from partially conductive to fully conductive. This results in node 146 being fully latched at a logic high with transmission gate 122 coupling the output of inverter 104, which is at a logic low as an inversion of node 146, to node 142. With node 142 at a logic low, AOI22 102 provides a logic high on node 146. Clock C1$b$ at a logic low ensures that the logic state of node 144 does not affect the logic state of node 146. In this configuration, transmission gates 124 and 122 function as one latch portion and transmission gates 126 and 130 function as another latch portion each of which alternately function with inverter 104 and AOI22 102 to receive and latch the new data. In this transition of a rising edge of the clock, transmission gate 124 provides the new data and transmission gate 122 provides the coupling for the inversion by inverter 104 from node 146 to 142 that establishes the latching of data on node 146.

On the falling edge of the clock, clock C1 transitions to a logic low. Prior to the transition, transmission gate 126 is coupling input signal D to node 144. At setup, input signal D is held at a logic state, which in this example will be a logic high so that a logic low is to be latched on node 146. When clock C1 switches to a logic low, node 142 is no longer controlling node 146. When clock C1$b$ switches to a logic high, node 144 begins controlling node 146. Node 146 becomes the inversion of node 144, which in this example is a logic low for node 146. A transition occurs for transmission gates 122, 124, 126, and 128 with transitions by clocks C2 and C2$b$. Transmission gates 122 and 126 transition from fully conducting to non-conducting. Transmission gates 124 and 130 transition from non-conducting to fully conducting. The result is that the logic state of node 146, as the inversion of the new data, is latched by transmission gate 130 coupling the output of inverter 104 to node 144. Node 144 is isolated from input signal D by transmission gate 126 being non-conducting. In this transition of a falling edge of the clock, transmission gate 126 provides the new data and transmission gate 130 provides the coupling for the inversion by inverter 104 from node 146 to 144 that establishes the latching of data on node 146. The process thus alternates between rising edges and falling edges of the clock in an efficient manner for latching data on the both edges.

Figure 5:
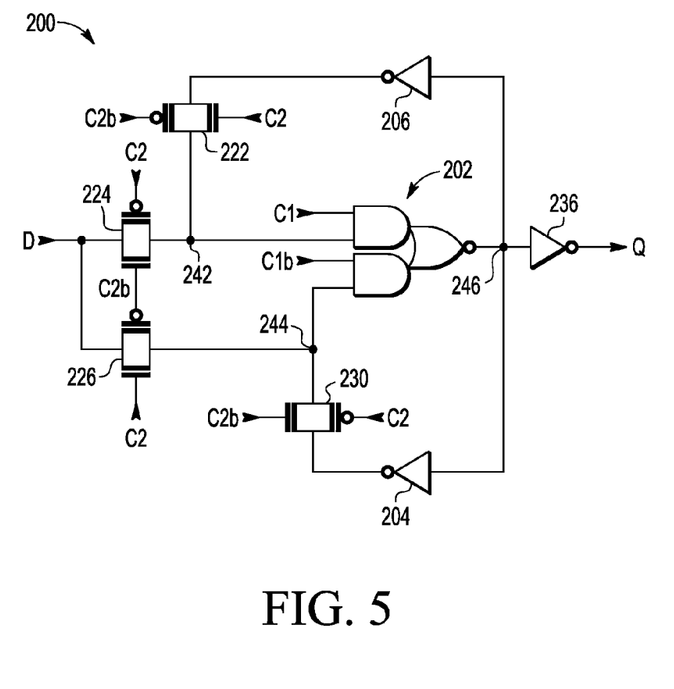
FIG. 5 is a combination circuit and logic diagram of a DET flip-flop according to a second embodiment.

Shown in FIG. 5 is a DET flop 200 comprising an AOI22 202, inverters 204, 206, and 236, and transmission gates 222, 224, 226, and 230. AOI22 202 has a first input of the first AND for receiving clock C1, a second input of the first AND connected to a node 242, a first input of the second AND for receiving clock C1b, a second input of the second AND connected to a node 244, and an output connected to a node 246. Inverter 204 has an input connected to node 246 and an output. Inverter 206 has an input connected to node 246 and an output. Transmission gate 222 has a first signal terminal connected to node 242, a second signal terminal connected to the output of inverter 206, a non-inverting control input for receiving clock C2, and an inverting control input for receiving clock C2b. Transmission gate 224 has a first signal terminal for receiving input signal D, a second signal terminal connected to node 242, an inverting control terminal for receiving clock C2, and a non-inverting control terminal for receiving clock C2b. Transmission gate 226 has a first signal terminal for receiving input signal D, a second signal terminal connected to node 244, an inverting control terminal for receiving clock C2b, and a non-inverting control terminal for receiving clock C2. Transmission gate 230 has a first signal terminal connected to node 244, a second signal terminal connected to the output of inverter 204, a non-inverting control input for receiving clock C2b, and an inverting control input for receiving clock C2. Inverter 236 has an input connected to node 246 and an output for providing output signal Q. In this case, inverter 206, transmission gate 222, and transmission gate 224 may be considered one latch portion, and inverter 204, transmission gate 230, and transmission gate 226 may be considered another latch portion. Each latch portion uses AOI22 202.

In the case of a rising edge of the clock, a transition of clock C1 from a logic low to a logic high, transmission gate 224 couples the new data onto node 242 because transmission gate 224 is conductive when clock C1 transitions from a logic low to a logic high because clock C2 is a logic high and clock C2b is a logic low when clock C1 transitions from a logic low to a logic high. Immediately after the rising edge of clock C1, clock C1b transitions to a logic low so that node 244 no longer affects the output of AOI22 202 and the logic state of node 242 does by causing AOI22 202 to provide the inversion of the logic state on node 242 to node 246. Thus the logic state of D at the rising edge of the clock determines the logic state of node 246. The new logic state of node 246 is latched by inverter 206 and transmission gate 222 becoming conductive when clock C2 becomes a logic high and clock C2b becomes a logic low. Transmission gates 224 and 230 become non-conductive due to clock C2 becoming a logic high and clock C2b becoming a logic low. Transmission gate 226 becomes conductive due to clock C2 becoming a logic high and clock C2b becoming a logic low so that the logic state of input signal D is coupled to node 244. Node 244 does not affect node 246 because clock C1b is a logic low.

In the case of a falling edge of the clock, a transition of clock C1 from a logic high to a logic low, transmission gate 226 couples the new data onto node 244 because transmission gate 226 is conductive when clock C1 transitions from a logic high to a logic low because clock C2 is a logic low and clock C2b is a logic high when clock C1 transitions from a logic high to a logic low. Immediately after the falling edge of clock C1, clock C1b transitions to a logic high so that node 242 no longer affects the output of AOI22 202 and the logic state of node 244 does by causing AOI22 202 to provide the inversion of the logic state on node 244 to node 246. Thus the logic state of D at the falling edge of the clock determines the logic state of node 246. The new logic state of node 246 is latched by inverter 204 and transmission gate 230 becoming conductive when clock C2 becomes a logic low and clock C2b becomes a logic high. Transmission gates 222 and 226 become non-conductive due to clock C2 becoming a logic low and clock C2b becoming a logic high. Transmission gate 224 becomes conductive due to clock C2 becoming a logic low and clock C2b becoming a logic high so that the logic state of input signal D is coupled to node 242. Node 242 does not affect node 246 because clock C1 is a logic low.

Thus, in the case of DET flop 200, alternate logic portions are alternately combined with other circuitry, AOI22, to latch data on both the rising edge and the falling edge of the clock.

In each DET flop 18, 100, and 200 a different latch is formed for latching data on the rising edge than from latching data on the falling edge of the clock. The latching can be considered storage even though the storage is only between clock edges which may be very short. On the other hand, because the data is actively latched there is no time requirement for the clock edges. A clock could be stopped between edges and the data would remain latched until another clock edge is received. In each case there is are alternate portions which use a common element or elements to achieve the latching. Although not a complete unto itself for achieving storage, the common element may be considered a storage element because it is an element of a circuit combination that achieves storage, in this case by latching.

As shown in FIG. 1, a plurality of delayed clock signals are generated by a clock generator circuit and this plurality of delayed clock signals are used in performing the DET flop function. A bank of DET flops may share these delayed clock signals so that only one clock generator may be needed for the entire bank.

By now it should be appreciated that there has been provided a dual edge triggered flip flop circuit that includes a single storage element and a first latch circuit and a second latch circuit coupled to alternate input to the single storage element between a first feedback path and a second feedback path on rising and falling edges of a first clock signal. The dual edge triggered flip flop circuit may have a further characterization by which the first latch circuit is in a conducting state and the second latch circuit is in a non-conducting state for a first window of time at the rising edge of the first clock signal and the second latch circuit is in a conducting state and the first latch circuit is in a non-conducting state for a second window of time at the falling edge of the first clock signal. The dual edge triggered flip flop circuit may further comprise a clock signal generator configured to receive the first clock signal and to output a plurality of clock signals including a first inverted clock signal, a second clock signal, and a second inverted clock signal, wherein the plurality of clock signals are delayed from one another and from the first clock signal by respective specified intervals. The dual edge triggered flip flop circuit may have a further characterization by which the first latch circuit includes a first transmission gate, a second transmission gate, and a third transmission gate; an input to the third transmission gate is coupled to receive a data signal and operation of the third transmission gate is controlled by the second clock signal and the second inverted clock signal; an output of the third transmission gate is coupled to inputs of the first transmission gate and the second transmission gate; operation of the first transmission gate is controlled by the second clock signal and the first inverted clock signal; and operation of the second transmission gate is controlled by the second clock signal and the first inverted clock signal. The dual edge triggered flip flop circuit may have a further characterization by which the second latch circuit includes a first transmission gate, a second transmission gate, and a third transmission gate; an input to the third transmission gate is coupled to receive the data signal and operation of the third transmission gate is controlled by the second clock signal and the second inverted second clock signal; an output of the third transmission gate is coupled to inputs of the first transmission gate and the second transmission gate; operation of the first transmission gate is controlled by the second clock signal and the first inverted clock signal; and operation of the second transmission gate is controlled by the second clock signal and the first inverted clock signal. The dual edge triggered flip flop circuit may have a further characterization by which the single storage element includes an AND-OR-Invert circuit; the first latch circuit includes a first transmission gate and a second transmission gate; an input to the first transmission gate is coupled to receive a data signal; an output of the first transmission gate is coupled to a first input of the AND-OR-Invert circuit; an input to the second transmission gate is coupled to receive a feedback signal from the single storage element; and an output of the second transmission gate is coupled between the first transmission gate and the first input of the AND-OR-Invert circuit. The dual edge triggered flip flop circuit may have a further characterization by which the second latch circuit includes a first transmission gate and a second transmission gate; an input to the first transmission gate is coupled to receive the data signal; an output of the first transmission gate is coupled to a second input of the AND-OR-Invert circuit; an input to the second transmission gate is coupled to receive the feedback signal from the single storage element; and an output of the second transmission gate is coupled to the second input of the AND-OR-Invert circuit. dual edge triggered flip flop circuit may have a further characterization by which the first clock signal and the first inverted first clock signal are coupled to control operation of the AND-OR-Invert circuit; and the second clock signal and the second inverted clock signal are coupled to control operation of the first and second transmission gates of the first and second latch circuits.

Described also is a dual edge triggered flip flop circuit having a storage element shared between a first latch circuit and a second latch circuit. The dual edge triggered flip flop circuit further includes a clock signal generator configured to receive a first clock signal and to output a plurality of clock signals including a first inverted clock signal, a second clock signal, and a second inverted clock signal, wherein the plurality of clock signals are delayed from one another and from the first clock signal by respective specified intervals. The edge triggered flip flop circuit has a further characterization by which the first latch circuit includes a first transmission gate controlled by the second clock signal and the second inverted clock signal to allow input of first data to the storage element during a period of time after a rising edge of the first clock signal. The edge triggered flip flop circuit has a further characterization by which the second latch circuit includes a first transmission gate controlled by the second clock signal and the second inverted clock signal in polarity opposite to the first transmission gate of the first latch circuit to allow input of second data to the storage element during a period of time after the falling edge of the first clock signal. The edge triggered flip flop circuit may have a further characterization by which the first latch circuit further includes a second transmission gate and a third transmission gate, the second and third transmission gates of the first latch circuit comprise a P-MOS switch controlled by the first inverted clock signal and a N-MOS switch controlled by the second clock signal.

The edge triggered flip flop circuit may have a further characterization by which the second latch circuit further includes a second transmission gate and a third transmission gate, the second and third transmission gates of the second latch circuit comprise a P-MOS switch controlled by the second clock signal and a N-MOS switch controlled by the first inverted clock signal. The edge triggered flip flop circuit may have a further characterization by which the storage element includes a first inverter and a second inverter and in the first latch: an output of the second transmission gate is coupled to an input of the first inverter; an output of the first inverter is coupled to an input of the second inverter; an output of the second inverter is coupled to an input of the third transmission gate; an output of the third transmission gate is coupled to an input of the second transmission gate; an output of the first transmission gate is coupled between the output of the third transmission gate and the input of the second transmission gate; and an input to the first transmission gate is coupled to receive first and second data. The edge triggered flip flop circuit may have a further characterization by which in the second latch: an output of the second transmission gate is coupled to the input of the first inverter; the output of the first inverter is coupled to the input of the second inverter, the output of the second inverter is coupled to an input of the third transmission gate an output of the third transmission gate is coupled to an input of the second transmission gate; an output of the first transmission gate is coupled between the output of the third transmission gate and the input of the second transmission gate; and the input of the first transmission gate in the first latch circuit is coupled to the input of the first transmission gate in the second latch circuit. The edge triggered flip flop circuit may have a further characterization by which the first latch circuit further includes a second transmission gate comprising a P-MOS switch controlled by the second inverted clock signal and a N-MOS switch controlled by the second clock signal; and the second latch circuit further includes a second transmission gate comprising a P-MOS switch controlled by the second inverted clock signal and a N-MOS switch controlled by the second clock signal. The edge triggered flip flop circuit may have a further characterization by which the storage element includes an AND-OR-Invert circuit, and in the first latch an input to the first transmission gate is coupled to receive the first and second data; an output of the first transmission gate is coupled to a first input of the AND-OR-Invert circuit; an input to the second transmission gate is coupled to receive a feedback signal from the storage element; and an output of the second transmission gate is coupled between the first transmission gate and the first input of the AND-OR-Invert circuit; and in the second latch circuit an input to the first transmission gate is coupled to receive a data signal; an output of the first transmission gate is coupled to a second input of the AND-OR-Invert circuit; an input to the second transmission gate is coupled to receive the feedback signal from the storage element; and an output of the second transmission gate is coupled to the second input of the AND-OR-Invert circuit. The edge triggered flip flop circuit may have a further characterization by which the second transmission gate of the first latch circuit and the first transmission gate of the second latch circuit include a N-MOS switch controlled by the second clock signal and a P-MOS switch controlled by the second inverted clock signal; the first transmission gate of the first latch circuit and the second transmission gate of the second latch circuit include a N-MOS switch controlled by the second inverted clock signal and a P-MOS switch controlled by the second clock signal; and the first clock signal and the first inverted clock signal are coupled to control operation of the AND-OR-Invert circuit.

The edge triggered flip flop circuit may have a further characterization by which the storage element includes an AND-OR-Invert circuit; the first latch circuit further includes a second transmission gate comprising a P-MOS switch controlled by the second clock signal and a N-MOS switch controlled by the second inverted clock signal; the second latch circuit further includes a second transmission gate comprising a P-MOS switch controlled by the second inverted clock signal and a N-MOS switch controlled by the second clock signal; and the first clock signal and the first inverted clock signal are coupled to control operation of the AND-OR-Invert circuit.

Also described is a method for operating a dual edge triggered flip flop circuit including generating a plurality of clock signals that are delayed from a first clock signal and from one another by respective intervals. The method further includes using a first set of the plurality of clock signals to operate a first latch circuit to allow first data to be conducted to a storage element for a period of time after a rising edge of a first clock signal. The method further includes using the first set of the plurality of clock signals to operate a second latch circuit to allow second data to be conducted to the storage element for a period of time after a falling edge of the first clock signal. The method may further comprise using the first clock signal and one of the plurality of clock signals to operate the storage element. The method may have a further characterization by which the plurality of clock signals including a first inverted clock signal, a second clock signal, and a second inverted clock signal; and the first clock signal and the plurality of clock signals are delayed from one another by an amount of time required for the first data and the second data to pass through a storage loop.

Although the invention is described herein with reference to specific embodiments, various modifications and changes can be made without departing from the scope of the present invention as set forth in the claims below. For example, specific implementations of transmission gates have been shown, but it may be possible to achieve desirable results with less than two transistor transmission gates. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A dual edge triggered flip flop circuit, comprising:
a single storage element;
a first latch circuit and a second latch circuit coupled to alternate input to the single storage element between a first feedback path and a second feedback path on rising and falling edges of a first clock signal; and
a clock signal generator configured to receive the first clock signal and to output a plurality of clock signals including a first inverted clock signal, a second clock signal, and a second inverted clock signal, wherein the plurality of clock signals are delayed from one another and from the first clock signal by respective specified intervals; and
wherein:
the first latch circuit is in a conducting state and the second latch circuit is in a non-conducting state for a first window of time at the rising edge of the first clock signal; and
the second latch circuit is in a conducting state and the first latch circuit is in a non-conducting state for a second window of time at the falling edge of the first clock signal.

2. The dual edge triggered flip flop circuit of claim 1, wherein:
the first latch circuit includes a first transmission gate, a second transmission gate, and a third transmission gate;
an input to the third transmission gate is coupled to receive a data signal and operation of the third transmission gate is controlled by the second clock signal and the second inverted clock signal;
an output of the third transmission gate is coupled to inputs of the first transmission gate and the second transmission gate;
operation of the first transmission gate is controlled by the second clock signal and the first inverted clock signal; and
operation of the second transmission gate is controlled by the second clock signal and the first inverted clock signal.

3. The dual edge triggered flip flop circuit of claim 2 further wherein:
the second latch circuit includes a first transmission gate, a second transmission gate, and a third transmission gate;
an input to the third transmission gate is coupled to receive the data signal and operation of the third transmission gate is controlled by the second clock signal and the second inverted second clock signal;
an output of the third transmission gate is coupled to inputs of the first transmission gate and the second transmission gate;
operation of the first transmission gate is controlled by the second clock signal and the first inverted clock signal; and
operation of the second transmission gate is controlled by the second clock signal and the first inverted clock signal.

4. The dual edge triggered flip flop circuit of claim 1, wherein:
the single storage element includes an AND-OR-Invert circuit; and
the first latch circuit includes a first transmission gate and a second transmission gate;
an input to the first transmission gate is coupled to receive a data signal;
an output of the first transmission gate is coupled to a first input of the AND-OR-Invert circuit;
an input to the second transmission gate is coupled to receive a feedback signal from the single storage element; and
an output of the second transmission gate is coupled between the first transmission gate and the first input of the AND-OR-Invert circuit.

5. The dual edge triggered flip flop circuit of claim 4, wherein:
the second latch circuit includes a first transmission gate and a second transmission gate;
an input to the first transmission gate is coupled to receive the data signal,
an output of the first transmission gate is coupled to a second input of the AND-OR-Invert circuit,
an input to the second transmission gate is coupled to receive the feedback signal from the single storage element; and
an output of the second transmission gate is coupled to the second input of the AND-OR-Invert circuit.

6. The dual edge triggered flip flop circuit of claim 5, wherein:
the first clock signal and the first inverted first clock signal are coupled to control operation of the AND-OR-Invert circuit; and
the second clock signal and the second inverted clock signal are coupled to control operation of the first and second transmission gates of the first and second latch circuits.

7. A dual edge triggered flip flop circuit comprising:
a storage element shared between a first latch circuit and a second latch circuit;
a clock signal generator configured to receive a first clock signal and to output a plurality of clock signals including a first inverted clock signal, a second clock signal, and a second inverted clock signal, wherein the plurality of clock signals are delayed from one another and from the first clock signal by respective specified intervals;
the first latch circuit includes a first transmission gate controlled by the second clock signal and the second inverted clock signal to allow input of first data to the storage element during a period of time after a rising edge of the first clock signal; and
the second latch circuit includes a first transmission gate controlled by the second clock signal and the second inverted clock signal in polarity opposite to the first transmission gate of the first latch circuit to allow input of second data to the storage element during a period of time after the falling edge of the first clock signal;
wherein the first latch circuit further includes a second transmission gate and a third transmission gate, the second and third transmission gates of the first latch circuit comprise a P-MOS switch controlled by the first inverted clock signal and a N-MOS switch controlled by the second clock signal.

8. The dual edge triggered flip flop circuit of claim 7, wherein:
the second latch circuit further includes a second transmission gate and a third transmission gate, the second and third transmission gates of the second latch circuit comprise a P-MOS switch controlled by the second clock signal and a N-MOS switch controlled by the first inverted clock signal.

9. The dual edge triggered flip flop circuit of claim 8, wherein:
the storage element includes a first inverter and a second inverter, in the first latch circuit:
an output of the second transmission gate is coupled to an input of the first inverter;
an output of the first inverter is coupled to an input of the second inverter;
an output of the second inverter is coupled to an input of the third transmission gate;
an output of the third transmission gate is coupled to an input of the second transmission gate;
an output of the first transmission gate is coupled between the output of the third transmission gate and the input of the second transmission gate; and
an input to the first transmission gate is coupled to receive first and second data.

10. The dual edge triggered flip flop circuit of claim 9 wherein:
in the second latch circuit:
an output of the second transmission gate is coupled to the input of the first inverter;
the output of the first inverter is coupled to the input of the second inverter,
the output of the second inverter is coupled to an input of the third transmission gate;
an output of the third transmission gate is coupled to an input of the second transmission gate;
an output of the first transmission gate is coupled between the output of the third transmission gate and the input of the second transmission gate; and
the input of the first transmission gate in the first latch circuit is coupled to the input of the first transmission gate in the second latch circuit.

11. The dual edge triggered flip flop circuit of claim 7 wherein:
the first latch circuit further includes a second transmission gate comprising a P-MOS switch controlled by the second inverted clock signal and a N-MOS switch controlled by the second clock signal; and
the second latch circuit further includes a second transmission gate comprising a P-MOS switch controlled by the second inverted clock signal and a N-MOS switch controlled by the second clock signal.

12. The dual edge triggered flip flop circuit of claim 11 wherein:
the storage element includes an AND-OR-Invert circuit;
in the first latch circuit:
an input to the first transmission gate is coupled to receive the first and second data;
an output of the first transmission gate is coupled to a first input of the AND-OR-Invert circuit;
an input to the second transmission gate is coupled to receive a feedback signal from the storage element; and
an output of the second transmission gate is coupled between the first transmission gate and the first input of the AND-OR-Invert circuit; and
in the second latch circuit:
an input to the first transmission gate is coupled to receive a data signal;
an output of the first transmission gate is coupled to a second input of the AND-OR-Invert circuit;
an input to the second transmission gate is coupled to receive the feedback signal from the storage element; and
an output of the second transmission gate is coupled to the second input of the AND-OR-Invert circuit.

13. The dual edge triggered flip flop circuit of claim 12 wherein:
the second transmission gate of the first latch circuit and the first transmission gate of the second latch circuit include a N-MOS switch controlled by the second clock signal and a P-MOS switch controlled by the second inverted clock signal;
the first transmission gate of the first latch circuit and the second transmission gate of the second latch circuit include a N-MOS switch controlled by the second inverted clock signal and a P-MOS switch controlled by the second clock signal; and the first clock signal and the first inverted clock signal are coupled to control operation of the AND-OR-Invert circuit.

14. The dual edge triggered flip flop circuit of claim 7 wherein:

the storage element includes an AND-OR-Invert circuit;

the first latch circuit further includes a second transmission gate comprising a P-MOS switch controlled by the second clock signal and a N-MOS switch controlled by the second inverted clock signal;

the second latch circuit further includes a second transmission gate comprising a P-MOS switch controlled by the second inverted clock signal and a N-MOS switch controlled by the second clock signal; and the first clock signal and the first inverted clock signal are coupled to control operation of the AND-OR-Invert circuit.

* * * * *